United States Patent
Inaba et al.

(10) Patent No.: US 9,597,956 B2
(45) Date of Patent: Mar. 21, 2017

(54) VEHICLE ROOF STRUCTURE AND VEHICLE, AND METHOD OF MANUFACTURING VEHICLE ROOF UNIT

(71) Applicant: KABUSHIKI KAISHA TOYOTA JIDOSHOKKI, Kariya-shi, Aichi-ken (JP)

(72) Inventors: Hirotaka Inaba, Kariya (JP); Hideaki Terai, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 0 days.

(21) Appl. No.: 14/553,411

(22) Filed: Nov. 25, 2014

(65) Prior Publication Data

US 2015/0145289 A1    May 28, 2015

(30) Foreign Application Priority Data

Nov. 28, 2013 (JP) ................. 2013-246418

(51) Int. Cl.
| | |
|---|---|
| B60K 16/00 | (2006.01) |
| B62D 25/06 | (2006.01) |
| B62D 29/00 | (2006.01) |
| B32B 37/04 | (2006.01) |
| B32B 37/10 | (2006.01) |
| B32B 17/10 | (2006.01) |
| H01L 31/048 | (2014.01) |
| H02S 20/20 | (2014.01) |
| B60J 7/00 | (2006.01) |

(52) U.S. Cl.
CPC .............. *B60K 16/00* (2013.01); *B32B 17/10* (2013.01); *B32B 37/04* (2013.01);
(Continued)

(58) Field of Classification Search
CPC ..... B60K 16/00; B32B 37/04; B32B 37/1018; H01L 31/048; H02S 20/20; B60J 7/00; B62D 25/06; B62D 29/005
(Continued)

(56) References Cited

U.S. PATENT DOCUMENTS 5,213,626 A * 5/1993 Paetz ................ B32B 17/10036
136/244
6,034,320 A * 3/2000 Malcherczyk ............. B60J 7/00
136/251
(Continued)

FOREIGN PATENT DOCUMENTS

EP 1755170 A2 2/2007
JP 62-85743 A 4/1987
(Continued)

OTHER PUBLICATIONS

Communication dated Nov. 10, 2015 from the Japanese Patent Office issued in corresponding Japanese Application No. 2013-246418.
(Continued)

*Primary Examiner* — Joseph D Pape
(74) *Attorney, Agent, or Firm* — Sughrue Mion, PLLC

(57) ABSTRACT

A vehicle roof structure includes a solar cell unit including a plurality of solar cells arranged in a planar form, a plate-like roof panel made of a resin having transparency and disposed to cover the solar cell unit from above, and a plurality of reinforcements each being implemented by a metallic member and disposed to support the solar cell unit from below and to extend in a vehicle longitudinal direction and/or a vehicle width direction. The vehicle roof can be reduced in weight.

5 Claims, 3 Drawing Sheets

(52) U.S. Cl.
CPC ............ *B32B 37/1018* (2013.01); *B60J 7/00* (2013.01); *B62D 25/06* (2013.01); *B62D 29/005* (2013.01); *H01L 31/048* (2013.01); *H02S 20/20* (2014.12); *B32B 2307/412* (2013.01); *B32B 2323/04* (2013.01); *B32B 2369/00* (2013.01); *B32B 2457/12* (2013.01); *B32B 2605/00* (2013.01); *B60K 2016/003* (2013.01); *Y02E 10/50* (2013.01); *Y02T 10/90* (2013.01)

(58) Field of Classification Search
USPC .......................................... 210/210; 296/210
See application file for complete search history.

(56) References Cited

U.S. PATENT DOCUMENTS

| | | | |
|---|---|---|---|
| 6,318,798 B1 | 11/2001 | Bergmiller | |
| 2002/0008410 A1* | 1/2002 | Teschner | ........... B32B 17/10018 296/211 |
| 2002/0008412 A1* | 1/2002 | Patz | ....................... B62D 25/06 296/211 |
| 2003/0151275 A1* | 8/2003 | Ohnishi | ..................... B60J 7/05 296/216.08 |
| 2011/0226312 A1 | 9/2011 | Bohm et al. | |
| 2012/0248826 A1* | 10/2012 | Motomura | ............... B60J 10/24 296/216.07 |
| 2015/0129325 A1 | 5/2015 | Shirai et al. | |

FOREIGN PATENT DOCUMENTS

| | | |
|---|---|---|
| JP | 06-005901 A | 1/1994 |
| JP | 11-157342 A | 6/1999 |
| JP | 2015-93524 A | 5/2015 |
| WO | 2010017847 A1 | 2/2010 |
| WO | 2010/066213 A2 | 6/2010 |

OTHER PUBLICATIONS

Communication dated Apr. 21, 2015 from the European Patent Office in counterpart Application No. 14194943.8.

* cited by examiner

VEHICLE ROOF STRUCTURE AND VEHICLE, AND METHOD OF MANUFACTURING VEHICLE ROOF UNIT

This nonprovisional application is based on Japanese Patent Application No. 2013-246418 filed on Nov. 28, 2013 with the Japan Patent Office, the entire contents of which are hereby incorporated by reference.

BACKGROUND OF THE INVENTION

Field of the Invention

The present invention relates to a vehicle roof structure having solar cells and a vehicle provided with such a vehicle roof structure, as well as a method of manufacturing a vehicle roof unit having solar cells.

Description of the Background Art

As disclosed in Japanese Patent Laying-Open No. 11-157342, vehicles having a roof with solar cells mounted thereon are known. The vehicle roof suffers from various impacts from external environments, such as snow coverage in a snowy district or pressure by a car washer. When the roof deforms greatly upon receipt of an impact from the outside, the solar cells may break down so that they can no longer generate electric power appropriately. Therefore, a glass plate having relatively high strength and rigidity as well as high transparency is commonly used for the vehicle roof provided with solar cells as a member constituting the outer surface of the roof panel.

Japanese Patent Laying-Open No. 06-005901 describes a solar cell module with solar cells inserted in fiber-reinforced plastic (FRP), the solar cell module being provided with a curved surface as a whole and being bent at its periphery to increase rigidity.

SUMMARY OF THE INVENTION

Glass has a specific gravity of about 2.5. To achieve a vehicle roof structure having predetermined strength and rigidity with which solar cells can be supported, the total weight of the roof is likely to be increased. The increase in weight of the roof reduces fuel efficiency and reduces stability of the vehicle during running. It is therefore contemplated using, instead of a glass plate, a resin panel made of a transparent resin having a specific gravity smaller than that of glass, as the member constituting the outer surface of the roof panel.

In the case of using a resin panel having a thickness equivalent to that of a glass plate in the roof panel that can support solar cells, however, the roof panel will be disadvantageously decreased in strength and rigidity required to support solar cells will become insufficient although the weight will be reduced. Moreover, in order to make strength and rigidity of the resin panel equivalent to those of a glass plate in the roof panel that can support solar cells, the resin panel will be increased in thickness, resulting in increased weight per unit area of the roof disadvantageously.

The present invention was made in view of the above actual circumstances, and has an object to provide a vehicle roof structure that can achieve weight reduction and a vehicle, as well as a method of manufacturing a vehicle roof unit.

A vehicle roof structure based on the present invention includes a solar cell unit including a plurality of solar cells arranged in a planar form, a plate-like roof panel made of a resin having transparency and disposed to cover the solar cell unit from above, and a plurality of reinforcements each being implemented by a metallic member and disposed to support the solar cell unit from below and to extend in a vehicle longitudinal direction and/or a vehicle width direction.

A vehicle based on the present invention includes the above-described vehicle roof structure based on the present invention.

A method of manufacturing a vehicle roof unit includes the steps of preparing a plate-like roof panel made of a resin having transparency, disposing a first sheet material made of a thermoplastic resin having transparency on the roof panel, arranging a plurality of solar cells in a planar form on the first sheet material, disposing a second sheet material made of a thermoplastic resin to cover the plurality of solar cells, disposing a film to cover the second sheet material, vacuum heating the first sheet material and the second sheet material between the film and the roof panel, thereby sealing the plurality of solar cells, and fixing a plurality of reinforcements, each being implemented by a metallic member, and the film to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
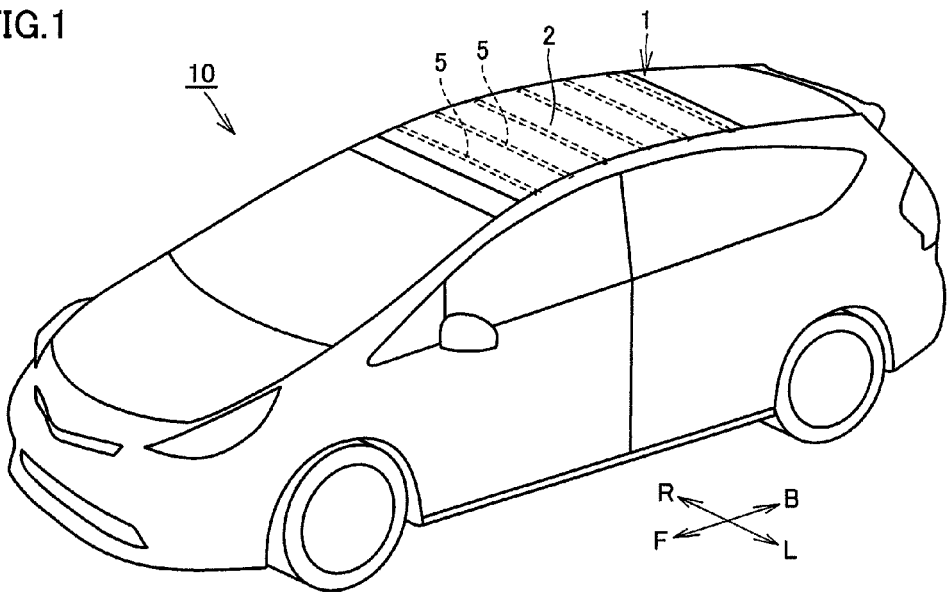
FIG. 1 is a perspective view showing a vehicle according to an embodiment.

Hereinafter, an embodiment will be described with reference to the drawings. When the number, an amount or the like is mentioned, the scope of the present invention is not necessarily limited to that number, that amount or the like, unless otherwise specified. The same or corresponding parts have the same reference characters allotted, and detailed description thereof will not be repeated.

FIG. 1 is a perspective view showing a vehicle 10 according to an embodiment. An arrow L in the drawing indicates the left direction of the vehicle, and an arrow R indicates the right direction of the vehicle. The direction along the arrows L and R is the width direction of the vehicle. An arrow F indicates the forward direction of the vehicle, and an arrow B indicates the backward direction of the vehicle. The direction along the arrows F and B is the longitudinal direction of the vehicle. These apply in common to FIGS. 2 to 4 which will be described later.

Figure 2:
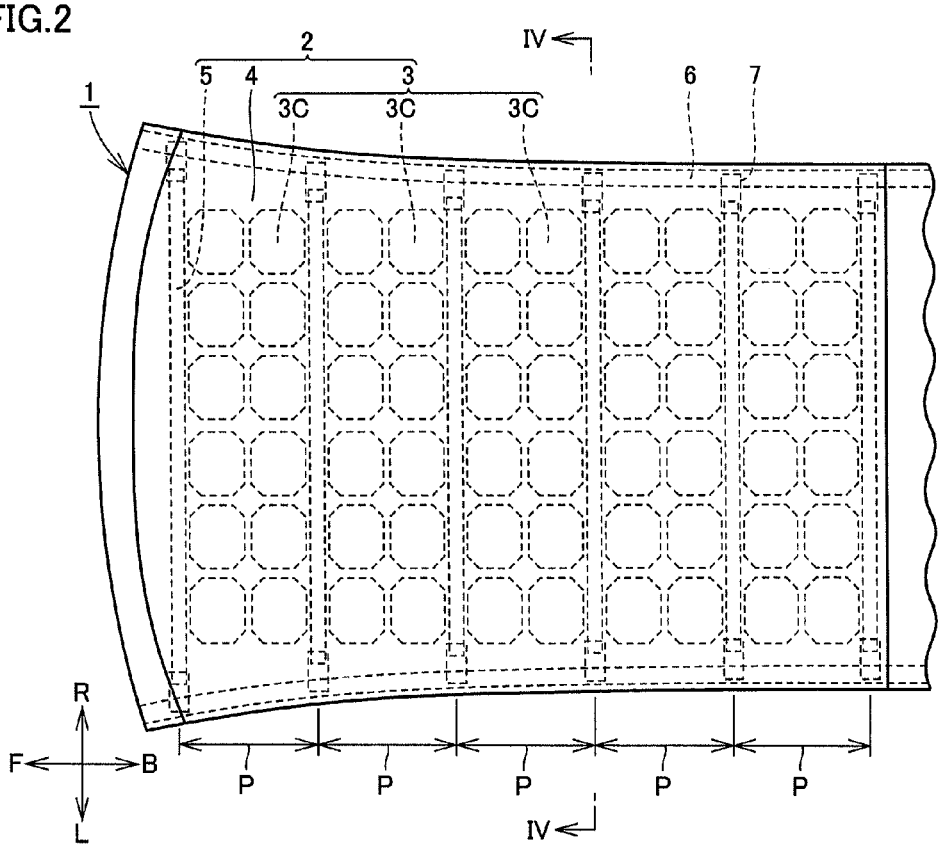
FIG. 2 is a partial plan view schematically showing a vehicle roof according to the embodiment.

As shown in FIG. 1, the vehicle 10 includes a vehicle roof structure 2 provided for a roof 1. FIG. 2 is a partial plan view schematically showing the roof 1 of the vehicle 10. As shown in FIG. 2, the roof 1 of the vehicle includes the vehicle roof structure 2 attached between roof side rails 6 arranged on the right and left.

Figure 3:
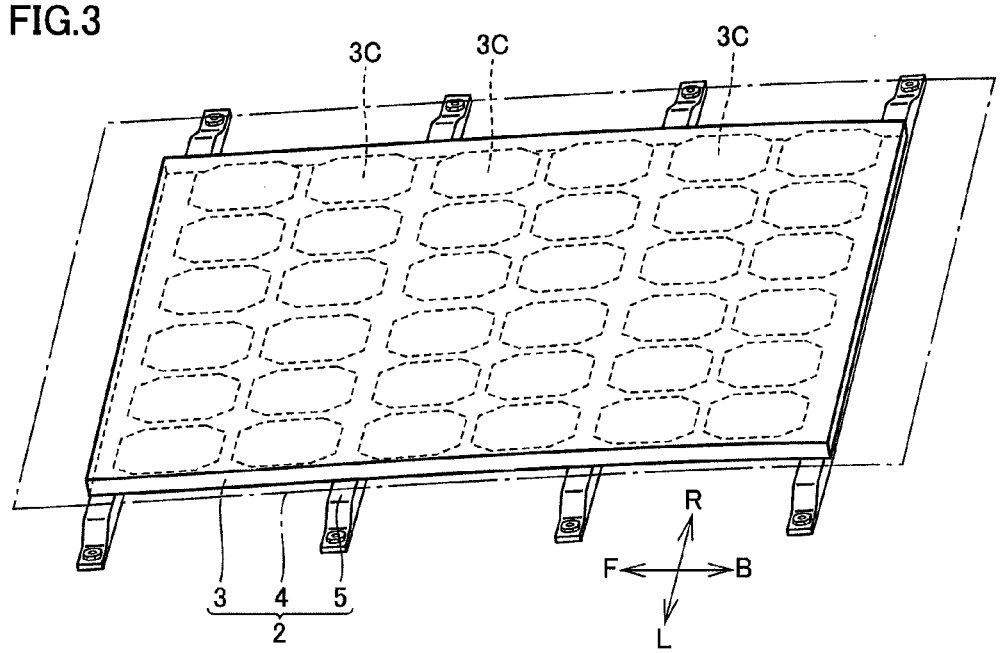
FIG. 3 is a perspective view schematically showing a vehicle roof structure provided for the vehicle according to the embodiment.
Figure 4:
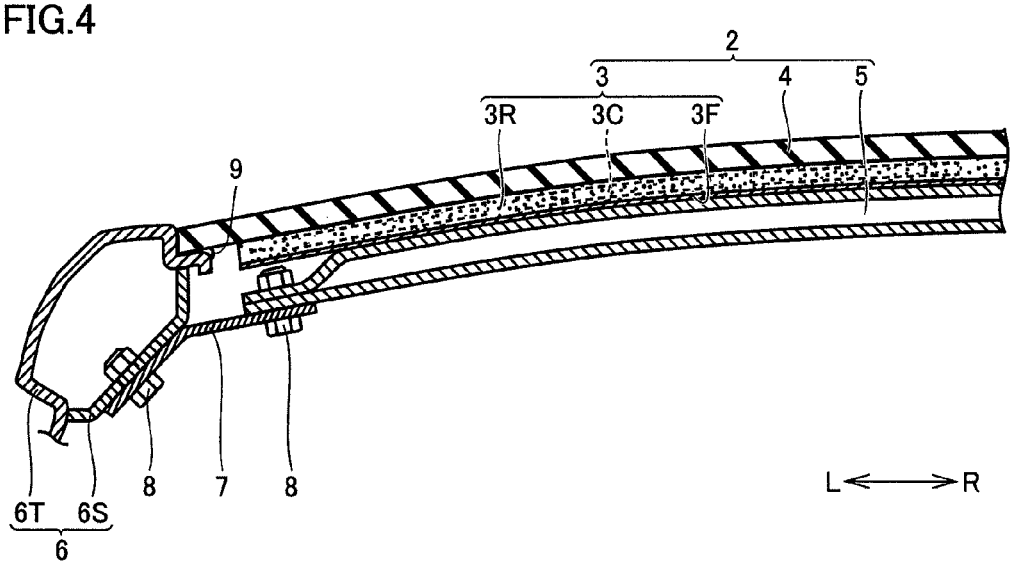
FIG. 4 is cross sectional view taken along the line IV-IV in FIG. 2.

FIG. 3 is a perspective view schematically showing the vehicle roof structure 2. FIG. 4 is a cross sectional view taken along the line IV-IV in FIG. 2. As shown in FIGS. 2 to 4, the vehicle roof structure 2 includes a solar cell unit 3, a roof panel 4, and a plurality of reinforcements 5. The solar cell unit 3 includes a plurality of solar cells 3C, a sealing resin 3R (FIG. 4), and a film 3F (FIG. 4) provided on the lower surface side of the sealing resin 3R.

The plurality of solar cells 3C are arranged in a planar form at intervals from one another, and are connected to one another in series and in parallel to constitute a battery. In the present embodiment, the plurality of solar cells 3C are arranged in a matrix form. Each of the solar cells 3C includes a silicon-based crystal, and has characteristics of easily breaking down in the case of receiving an excessive bending load. The size, shape and number of the solar cells 3C included in the solar cell unit 3, as well as the interval between the solar cells 3C adjacent to each other are configured such that the mounting density of the solar cells 3C is as large as possible in the roof panel 4 of the vehicle roof structure 2. As for the interval between the solar cells 3C adjacent to each other, its minimum required distance is set in accordance with various conditions, such as the wiring space of the solar cells 3C and a heat shrinkage absorption margin of the sealing resin.

The sealing resin 3R covers internal members within a module, such as the solar cells 3C which are power generation elements and wiring lines, to protect the internal members from permeation of water content and impacts. As the sealing resin 3R, a publicly known sealing resin material, such as EVA (ethylene acetic acid copolymer), PVB (polyvinyl butyral) or a silicone resin, is used. The sealing resin 3R seals the plurality of solar cells 3C, so that the plurality of solar cells 3C are adhered to the lower surface of the roof panel 4 (see FIG. 4). The film 3F is provided on the sealing resin 3R on the opposite side of the roof panel 4. The roof panel 4, the sealing resin 3R including the solar cells 3C, and the film 3F constitute an integrated unit.

The roof panel 4 is a member constituting part of the upper surface of the roof 1 of the vehicle 10, and has a plate-like shape. In FIG. 3, the roof panel 4 is schematically indicated by an alternate long and short dash line for the sake of convenience. The upper surface of the roof panel 4 constitutes the outer surface of the vehicle, and is exposed to the outside air. The roof panel 4 covers the solar cell unit 3 from above by its lower surface. In the present embodiment, a resin panel having transparency is used as the roof panel 4. Examples of a resin material constituting the roof panel 4 include a polycarbonate resin, an acrylic resin, a PET resin, and a vinyl chloride resin, which are appropriately selected in accordance with a use environment. Sunlight passes through the roof panel 4 to reach each of the solar cells 3C in the solar cell unit 3. A hard coating or the like is applied to the outer surface of the roof panel 4 made of a resin to increase damage resistance. The reinforcements 5 each have a shape extending in the form of rod, and are provided under the solar cell unit 3. The reinforcements 5 support the solar cell unit 3 from below (from the vehicle cabin side). The reinforcements 5 are each implemented by a member of metal, such as iron, and have a shape of rectangular tube (having a generally quadrilateral cross section) (see FIG. 3). The reinforcements 5 each extend in the vehicle width direction, and are arranged in parallel at intervals P (FIG. 2) from one another in the vehicle longitudinal direction. The interval P is 300 mm, for example. When the reinforcements 5 and the solar cells 3C are seen in a plan view, the reinforcements 5 are preferably arranged so as not overlap the solar cells 3C.

Referring to FIG. 4, a bracket 7 and fasteners 8 are used in order to fix the solar cell unit 3, the roof panel 4 and the reinforcements 5 to roof side rails 6 of the vehicle 10 (FIG. 1). The roof side rails 6 each include a side member outer panel 6T and a rail inner panel 6S, and extend in the vehicle longitudinal direction at the both side edges in the vehicle width direction.

One end of the bracket 7 closer to the roof side rail 6 is fixed to the rail inner panel 6S with the fastener 8, and the other end of the bracket 7 closer to the reinforcement 5 is fixed to the reinforcement 5 with another fastener 8. The reinforcement 5 is supported in a bridging manner at the both ends thereof by the roof side rails 6 on the left and right sides, with the bracket 7 on the left side of the vehicle and the bracket 7 (not shown) on the right side of the vehicle interposed therebetween, respectively. It is noted that the brackets 7 are not necessarily provided, but the reinforcements 5 may be attached directly to the roof side rails 6. The clearance left between the roof panel 4 and each of the roof side rails 6 is filled with a urethane-based adhesive 9.

(Functions and Effects)

As described at the beginning, glass has a higher Young's modulus (rigidity) than a typical resin, and is suitable for protecting solar cells from external loads imposed on the roof. In order to achieve a vehicle roof structure having predetermined rigidity, however, the total weight of the roof is likely to be increased because glass has a specific gravity of about 2.5.

Japanese Patent Laying-Open No. 06-005901 mentioned at the beginning discloses a solar cell module with solar cells inserted in FRP having a curved shape as a whole and bent at the ends to increase rigidity. However, sufficient strength is not necessarily obtained depending on design conditions, because the shape of the vehicle roof is determined in accordance with aerodynamic performance or design. In contrast, in the present embodiment, it is possible to achieve predetermined rigidity and also achieve weight reduction by the roof panel 4 made of a transparent resin and the plurality of reinforcements 5.

Let it be supposed that iron is adopted as the material of the reinforcements 5 and polycarbonate (PC) is adopted as the material of the roof panel 4. Iron (SS400) has a specific gravity of 7.86 $g/cm^3$, and PC has a specific gravity of 1.23 $g/cm^3$. Iron (SS400) has a Young's modulus of 192.08 GPa, and PC has a Young's modulus of 2.45 GPa. Iron (SS400) has a tensile strength of 400 MPa, and PC has a tensile strength of 104 MPa. The value of Young's modulus/specific gravity of iron is 24.4, while that of PC is 2. That is, the rigidity per unit weight of iron is about 10 times higher than that of PC.

It also turns out from the foregoing that the overall weight can be made lighter by adopting the reinforcements 5 to increase rigidity without making the thickness of the roof panel 4 very thick, than when increasing the thickness of the roof panel 4 to increase rigidity. For example, to obtain rigidity equivalent to that of 4-mm-thick glass only with PC, PC needs to have a thickness of about 15 mm, whereas with the combination of PC and the reinforcements 5, the thickness of PC can be reduced to 3.6 mm and the overall weight can also be reduced. It can be said that the overall weight can be reduced even in consideration of the additional weight of the reinforcements 5. For increasing the area of solar cells, the total weight of the roof is also increased with increase in area of the vehicle roof structure. With the combination of the roof panel 4 made of a resin and the reinforcements 5 described in the present embodiment, the degree of increase in weight can be made smaller than in the case of using a glass panel. Therefore, for increasing the area of solar cells, it can be said that the configuration according to the present embodiment is very advantageous as compared with the case of using a glass panel.

As described above, the solar cells 3C of the present embodiment are sealed with a transparent thermoplastic resin, such as EVA (Ethylene Vinyl Acetate). In Japanese Patent Laying-Open No. 06-005901, solar cells are insert-molded in fiber-reinforced plastic (FRP). By the method of sealing with EVA, a process step takes a shorter time than in the method of enclosing solar cells in FRP, so that productivity can be improved.

(Manufacturing Method)

As described above, the solar cell unit 3, the roof panel 4 and the reinforcements 5 having previously been integrated as a vehicle roof unit can be fixed to the bracket 7. Hereinafter, a method of manufacturing such a vehicle roof unit will be described.

Figure 5:
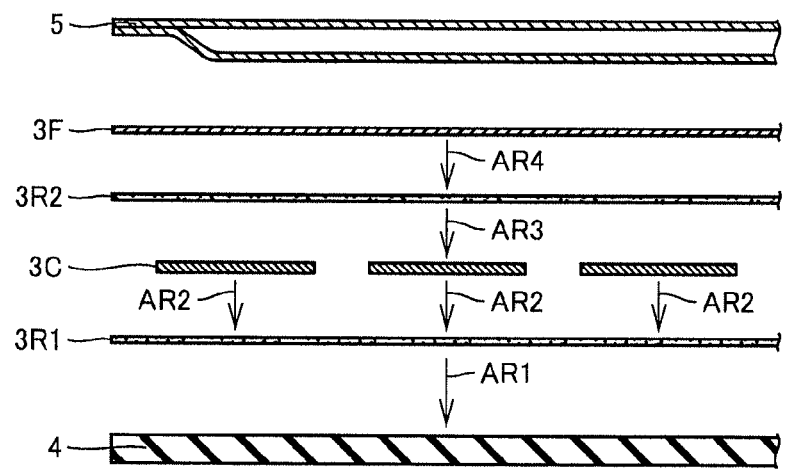
FIG. 5 is a cross sectional view showing a first step of a method of manufacturing a vehicle roof unit according to the embodiment.

Referring to FIG. 5, the roof panel 4, a first sheet material 3R1, the solar cells 3C, a second sheet material 3R2, the film 3F, and the reinforcements 5 are prepared first. The roof panel 4 is a member having a plate-like shape and being made of a resin having transparency (e.g., polycarbonate). The size and shape of the roof panel 4 correspond to the size and shape of a portion of the vehicle 10 (FIG. 1) where the roof panel 4 is to be provided.

The first sheet material 3R1 is disposed on the roof panel 4 (arrow AR1). The first sheet material 3R1 is a member made of a thermoplastic resin having transparency (e.g., EVA). Next, the plurality of solar cells 3C are arranged in a planar form on the first sheet material 3R1 (arrow AR2), and the second sheet material 3R2 is disposed to cover the plurality of solar cells 3C (arrow AR3). The second sheet material 3R2 is a member made of a thermoplastic resin (e.g., EVA) similar to that of the first sheet material 3R1. Then, the film 3F is disposed to cover the second sheet material 3R2 (arrow AR4).

Figure 6:
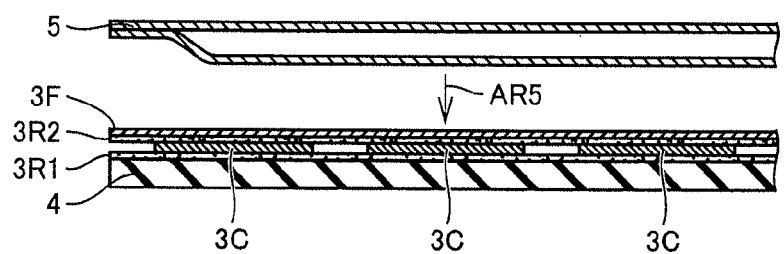
FIG. 6 is a cross sectional view showing a second step of the method of manufacturing a vehicle roof unit according to the embodiment.

Referring to FIG. 6, next, the first sheet material 3R1 and the second sheet material 3R2 are subjected to vacuum heating between the film 3F and the roof panel 4. The first sheet material 3R1 and the second sheet material 3R2 are melted. By stopping vacuum heating, the first sheet material 3R1 and the second sheet material 3R2 solidify to form a sealing resin (see the sealing resin 3R in FIG. 4). The plurality of solar cells 3C are sealed and adhered to the roof panel 4 with the sealing resin. Finally, the reinforcements 5 and the film 3F are fixed to each other by adhesion or the like (arrow AR5). As described above, the solar cell unit 3, the roof panel 4 and the reinforcements 5 are integrated as a vehicle roof unit.

(Variation)

Figure 7:
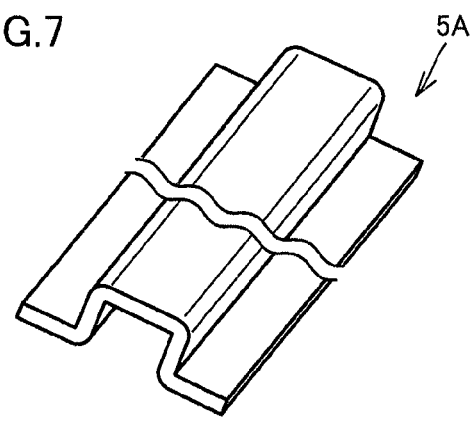
FIG. 7 is a perspective view showing a reinforcement used for a vehicle roof structure according to a variation of the embodiment.

The above-described reinforcements 5 each have a generally quadrilateral cross section. Even in the case of using a steel material having a hat-shaped cross section, such as a reinforcement 5A shown in FIG. 7, functions and effects similar to those described above can be obtained. The cross section of the reinforcement is preferably determined to assume a shape having the optimum moment of inertia of area depending on required rigidity. That is, the reinforcements 5 may have a U-shaped cross section.

The above-described reinforcements 5 are disposed to extend in the vehicle width direction. The reinforcements 5 may be disposed to extend in the vehicle longitudinal direction, or those extending in the vehicle width direction and those extending in the vehicle longitudinal direction may be combined together.

Although the embodiment of the present invention has been described, it should be understood that the embodiment disclosed herein is illustrative and non-restrictive in every respect. The scope of the present invention is defined by the claims, and is intended to include any modification within the meaning and scope equivalent to the terms of the claims.

What is claimed is:

1. A vehicle roof structure, comprising:
    a solar cell unit including a plurality of solar cells arranged in a planar form at intervals from one another;
    a plate-like roof panel made of a resin having transparency and disposed to cover said solar cell unit from above; and
    a plurality of reinforcements made of metal and disposed to support said solar cell unit from below and to extend in a vehicle longitudinal direction and/or a vehicle width direction,
    wherein, as viewed in plan view, the plurality of reinforcements are disposed and extends between adjacent solar cells so as not to overlap the plurality of solar cells of the solar cell unit.

2. The vehicle roof structure according to claim 1, wherein said resin is polycarbonate.

3. The vehicle roof structure according to claim 1, wherein said plurality of reinforcements extend in the vehicle width direction, and are arranged at intervals from one another in the vehicle longitudinal direction.

4. The vehicle roof structure according to claim 1, wherein said solar cell unit further includes a transparent thermoplastic resin sealing said plurality of solar cells and adhering said plurality of solar cells to said roof panel.

5. A vehicle comprising the vehicle roof structure as defined in claim 1.

* * * * *